(12) United States Patent
Ryu et al.

(10) Patent No.: US 7,358,816 B2
(45) Date of Patent: Apr. 15, 2008

(54) VARIABLE GAIN AMPLIFIER

(75) Inventors: Jae-young Ryu, Suwon-si (KR); Hyun-koo Kang, Yongin-si (KR); Dae-yeon Kim, Suwon-si (KR); Jeong-ho Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 109 days.

(21) Appl. No.: 11/172,883

(22) Filed: Jul. 5, 2005

(65) Prior Publication Data

US 2006/0097792 A1 May 11, 2006

(30) Foreign Application Priority Data

Nov. 11, 2004 (KR) .................. 10-2004-0091912
Nov. 11, 2004 (KR) .................. 10-2004-0091913

(51) Int. Cl.
*H03G 3/10* (2006.01)
(52) U.S. Cl. ..................... 330/285; 330/296
(58) Field of Classification Search ............. 330/285, 330/296, 278
See application file for complete search history.

(56) References Cited

U.S. PATENT DOCUMENTS

| | | | |
|---|---|---|---|
| 5,160,898 A | 11/1992 | Black | |
| 5,412,336 A | 5/1995 | Barrett, Jr. et al. | |
| 6,215,355 B1 | 4/2001 | Meck et al. | |
| 6,404,283 B1 | 6/2002 | Lau et al. | |
| 6,433,639 B1 * | 8/2002 | Numanami et al. | 330/277 |
| 6,549,076 B2 * | 4/2003 | Kuriyama | 330/296 |
| 6,628,168 B2 | 9/2003 | Martin et al. | |
| 6,737,920 B2 | 5/2004 | Jen et al. | |
| 6,842,075 B2 * | 1/2005 | Johnson et al. | 330/296 |

FOREIGN PATENT DOCUMENTS

| | | |
|---|---|---|
| JP | 62-272605 A | 11/1987 |
| JP | 11-340760 A | 12/1999 |
| JP | 2002-111417 A | 4/2002 |
| JP | 2004-80456 A | 3/2004 |
| JP | 2004-128704 A | 4/2004 |
| KR | 94-20668 A | 9/1994 |
| KR | 1996-0008364 Y1 | 9/1996 |
| KR | 1998-065102 A | 10/1998 |
| KR | 10-2004-0013229 A | 2/2004 |
| KR | 10-2004-0051365 A | 6/2004 |
| KR | 10-2004-0051366 A | 6/2004 |

* cited by examiner

*Primary Examiner*—Henry Choe
(74) *Attorney, Agent, or Firm*—Sughrue Mion, PLLC

(57) ABSTRACT

A variable gain amplifier (VGA) having stable input impedance matching and a stable noise figure in spite of a variation of an amplification gain is provided. In an embodiment of the VGA, a first stage of a cascode amplification unit has a fixed impedance regardless of a change of an amplification gain, and a variable gain determination unit comprised of a plurality of transistors is formed at an upper stage in the cascode amplification unit. Accordingly, a change of an input impedance of the cascode amplification unit due to the change of the amplification gain is minimized. In another embodiment of the VGA, an amplification gain of an amplification unit is controlled by adjusting a voltage applied to the amplification unit by controlling a current to be output by a current supply source, and stable input impedance matching and a stable noise figure are obtained.

13 Claims, 10 Drawing Sheets

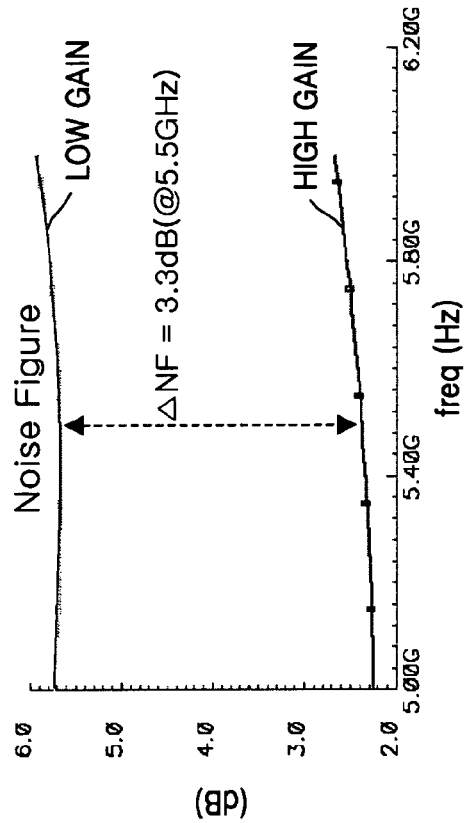
FIG. 11B Noise Figure
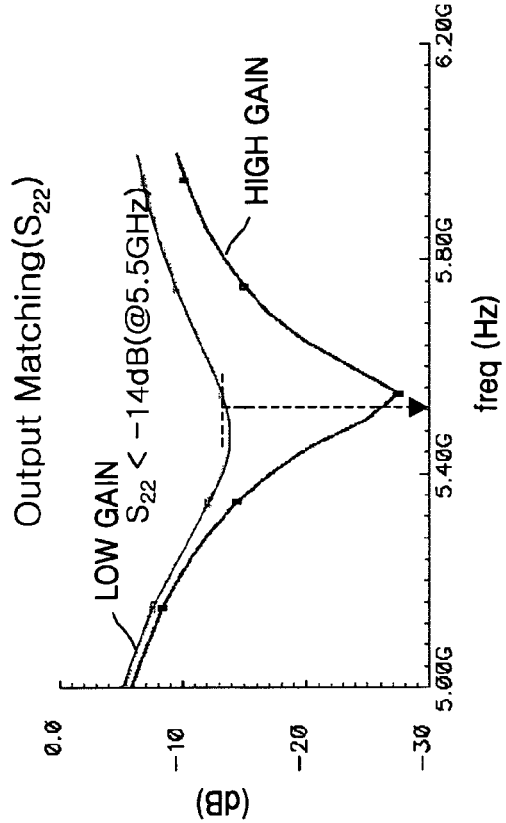
FIG. 11D Output Matching($S_{22}$)
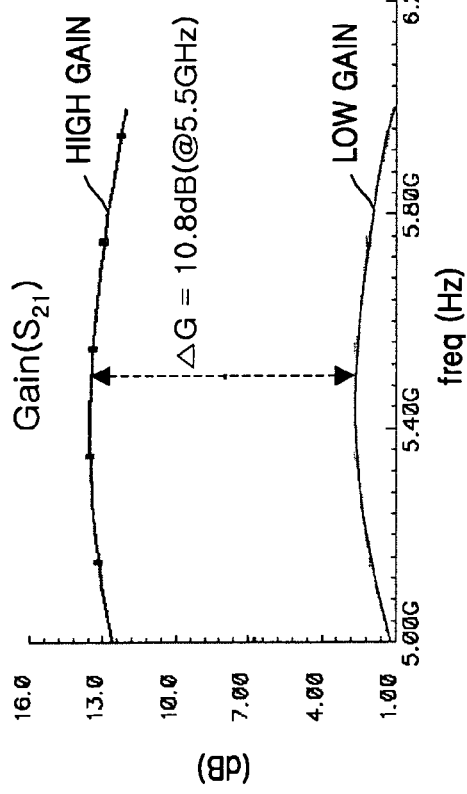
FIG. 11A Gain($S_{21}$)
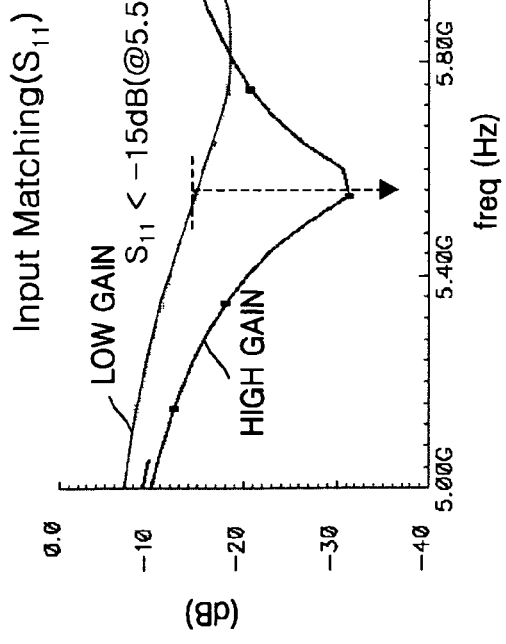
FIG. 11C Input Matching($S_{11}$)

VARIABLE GAIN AMPLIFIER

BACKGROUND OF THE INVENTION

This application claims priority from Korean Patent Application Nos. 10-2004-0091913 and 10-2004-0091912, both filed on Nov. 11, 2004 in the Korean Intellectual Property Office, the disclosures of which are incorporated herein in their entirety by reference.

1. Field of the Invention

Apparatuses consistent with the present invention relate to a variable gain amplifier (VGA), and more particularly, to a VGA that has a stable input impedance matching and a stable noise figure (NF) in spite of a change of an amplification gain.

2. Description of the Related Art

Generally, a VGA is used as a pre-power amplifier in a transmission unit of a wireless communication system and maintain an amplitude of a transmission signal constant. A VGA is also used as a low noise amplifier (LNA) in a reception unit of a wireless communication system and operate in a high gain mode when an amplitude of an input signal is small or in a low gain mode when the amplitude of the input signal is large, to thereby provide an appropriate amplification gain.

Such VGAs are designed in consideration of a signal to noise ratio (SNR), a frequency bandwidth, a low distortion factor, linearity, input/output matching, noise characteristics, and the like.

For example, a noise figure (NF) of a VGA used at a first stage of a reception unit has the greatest influence upon an NF of the entire reception unit. Thus, it is important that a VGA has a stable, low NF.

FIG. 1 is a circuit diagram of a conventional VGA. Referring to FIG. 1, the conventional VGA includes an input matching unit 10 comprised of an inductor L1, a cascode amplification unit 20 for amplifying an input signal and outputting an amplified signal, and an output matching unit 30 comprised of an inductor L2 and a capacitor C2.

The input matching unit 10 achieves matching with an input impedance of the cascode amplification unit 20. The output matching unit 30 performs matching with an output impedance of the cascode amplification unit 20.

The cascode amplification unit 20 comprises a common source amplification unit 21 and a common gate amplification unit 23. The common source amplification unit 21 includes a plurality of NMOS transistors N1 through Ni and a plurality of switches SW1 through SWi. The common gate amplification unit 23 is cascode connected to a common drain of the NMOS transistors N1 through Ni.

Gates of the NMOS transistors N1 through Ni, which constitute the common source amplification unit 21, are connected to an input port In and a first bias source Bias 1 via the switches SW1 through SWi, respectively. A gate of an NMOS transistor Nj, which constitutes the common gate amplification unit 23, is connected to a second bias source Bias 2. In FIG. 1, a first capacitor C1 is used to alternating current (AC) ground the NMOS transistor Nj of the common gate amplification unit 23.

The cascode amplification unit 20, in which the common source amplification unit 21 and the common gate amplification unit 23 are coupled together in a cascode configuration, reduces a Miller effect caused by a parasite capacitance between gates and drains of the transistors N1 through Ni. Accordingly, the cascode amplification unit 20 provides excellent frequency characteristics and is thus frequently used in high frequency amplifiers.

In such a conventional VGA, an amplification gain is determined according to selective on/off operations of the NMOS transistors N1 through Ni of the common source amplification unit 21. In other words, when the NMOS transistors N1 through Ni have different transconductance ($g_m$) values, and the switches SW1 through SWi are selectively turned on/off, a value of current induced to the common drain of the common source amplification unit 21 varies according to which one of the NMOS transistors N1 through Ni having different transconductance values is turned on. Consequently, the amplification gain varies according to which of the switches SW1 through SWi is selectively turned on/off.

For example, it is assumed that the first NMOS transistor Ni among the NMOS transistors N1 through Ni has the greatest transconductance and the i-th NMOS transistor Ni has the smallest transconductance. In this case, if the first switch SW1 is turned on and the rest are turned off, the conventional VGA operates in a high gain mode having the greatest amplification gain. On the other hand, if only the i-th switch SWi is turned on, the conventional VGA operates in a low gain mode having the smallest amplification gain.

However, in the conventional VGA as described above, an input impedance of the common source amplification unit 21 varies according to an amplification gain. More specifically, as the NMOS transistors N1 through Ni of the common source amplification unit 21 are selectively turned on/off to change the amplification gain, the input impedance of the common source amplification unit 21 varies. Hence, in the conventional VGA, the input impedance varies according to an amplification gain, and an NF also varies.

FIGS. 2A to 2D show graphs illustrating a gain, a noise figure, input impedance matching, and output impedance matching of the VGA of FIG. 1. The graphs of FIGS. 2A to 2D show results of simulations on a 0.18 μm CMOS RF MOSFET within a frequency range of 4.7 to 5.3 GHz.

Referring to FIG. 2A, the VGA of FIG. 1 in a high gain mode provides fairly good characteristics. However, as shown in FIGS. 2B and 2C, the VGA of FIG. 1 in a low gain mode provides a very bad noise figure and very bad input impedance matching. At an operating frequency of 5 GHz, the VGA in the low gain mode has a large noise figure of about 10 dB and input impedance matching of about −2 dB, which are worse than those in the high gain mode.

To sum up, in a conventional VGA, an input signal is connected to a common source amplification unit comprised of a plurality of transistors, and an input impedance varies according to which one of the transistors is turned on. Thus, with a change of an amplification gain, the input impedance becomes instable, and a noise figure greatly varies.

SUMMARY OF THE INVENTION

The present invention provides a variable gain amplifier having a stable noise figure in spite of a change of an amplification gain.

The present invention also provides a variable gain amplifier having a stable input impedance that does not easily vary with a change of an amplification gain.

According to an aspect of the present invention, there is provided a VGA which can vary an amplification gain, the VGA including a common source amplification unit amplifying an input signal while maintaining an input impedance constant, and a variable gain determination unit cascode connected to the common source amplification unit, amplifying a signal output by the common source amplification unit. The variable gain determination unit includes a plurality of transistors which are turned on/off by switches connected to gates of the transistors to vary the amplification gain.

According to another aspect of the present invention, there is provided a VGA which can vary an amplification gain, the VGA including: a differential common source amplification unit comprising a transistor pair receiving and amplifying a differential signal while maintaining an input impedance constant; and a differential variable gain determination unit cascode-connected to the differential common source amplification unit, amplifying a signal output by the differential common source amplification unit. The differential variable gain determination unit comprises a plurality of transistors which are turned on/off by switches connected to gates of the transistors to vary the amplification gain.

According to another aspect of the present invention, there is provided a VGA which can vary an amplification gain, the VGA including: an amplification gain control unit outputting a control signal for controlling the amplification gain; a current supply unit outputting a current that is controlled according to the control signal to be proportional to the amplification gain; a bias unit providing a voltage that is adjusted according to the current output by the current supply unit; and an amplification unit comprising a transistor of which an amplification gain varies according to a size of the voltage provided by the bias unit.

According to another aspect of the present invention, there is provided a VGA which can vary an amplification gain, the VGA including: a cascode amplification unit comprising a first amplification unit connected to an input port and a second amplification unit cascode connected to the first amplification unit; an amplification gain control unit outputting a control signal for controlling an amplification gain of the cascode amplification unit; a current supply unit outputting a current that is controlled according to the control signal to be proportional to the amplification gain; and a bias unit adjusting a voltage to be provided to the first amplification unit, according to the current output by the current supply unit.

BRIEF DESCRIPTION OF THE DRAWINGS

The above and other aspects of the present invention will become more apparent by describing in detail exemplary embodiments thereof with reference to the attached drawings in which:

FIG. 11A to 11D are graphs illustrating characteristics of the VGAs of FIGS. 7, 8, 9, and 10.

DETAILED DESCRIPTION OF EXEMPLARY EMBODIMENTS OF THE INVENTION

The present invention will now be described with reference to exemplary embodiments of the present invention where MOSFET transistors are used as active devices that constitute a variable gain amplifier. However, the spirit of the present invention is not limited to the use of the MOSFET transistors. It will be apparent to one of ordinary skill in the art that the spirit of the present invention can also be realized using other transistors, such as, BJTs, JFETs, MESEFTs, and the like.

Figure 3:
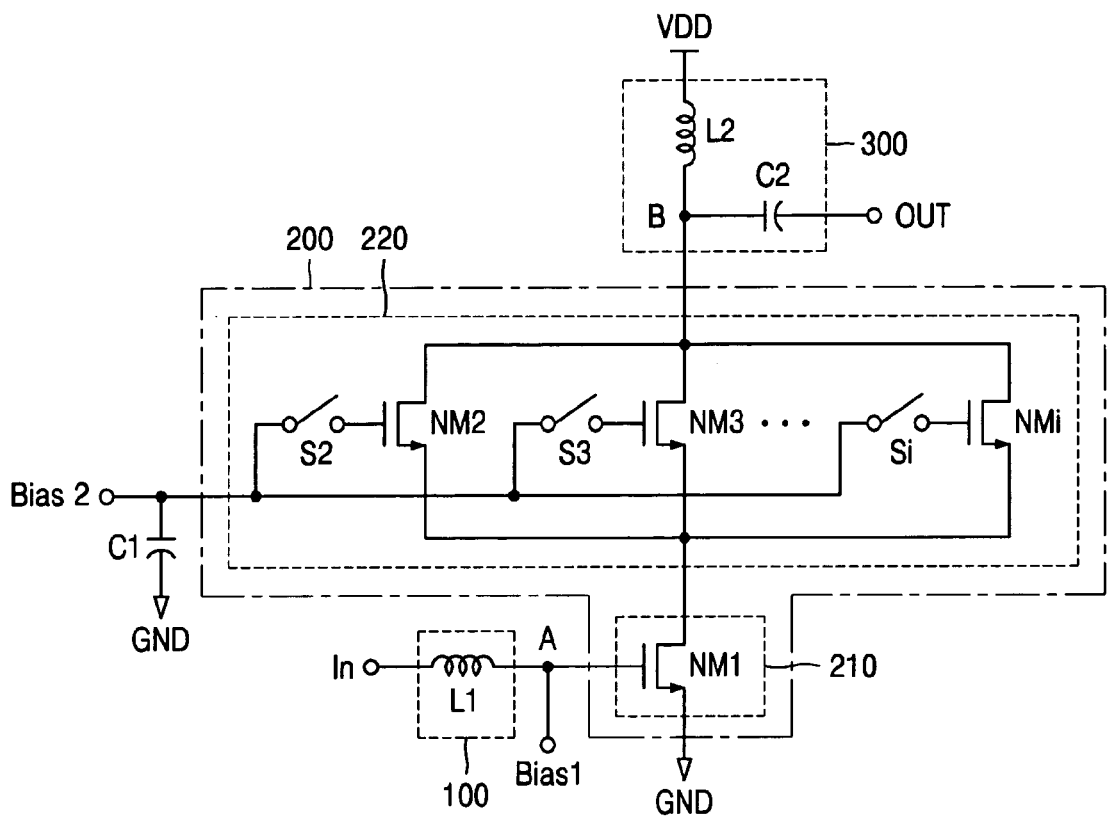
FIG. 3 is a circuit diagram of a VGA according to an exemplary embodiment of the present invention.
Figure 5:
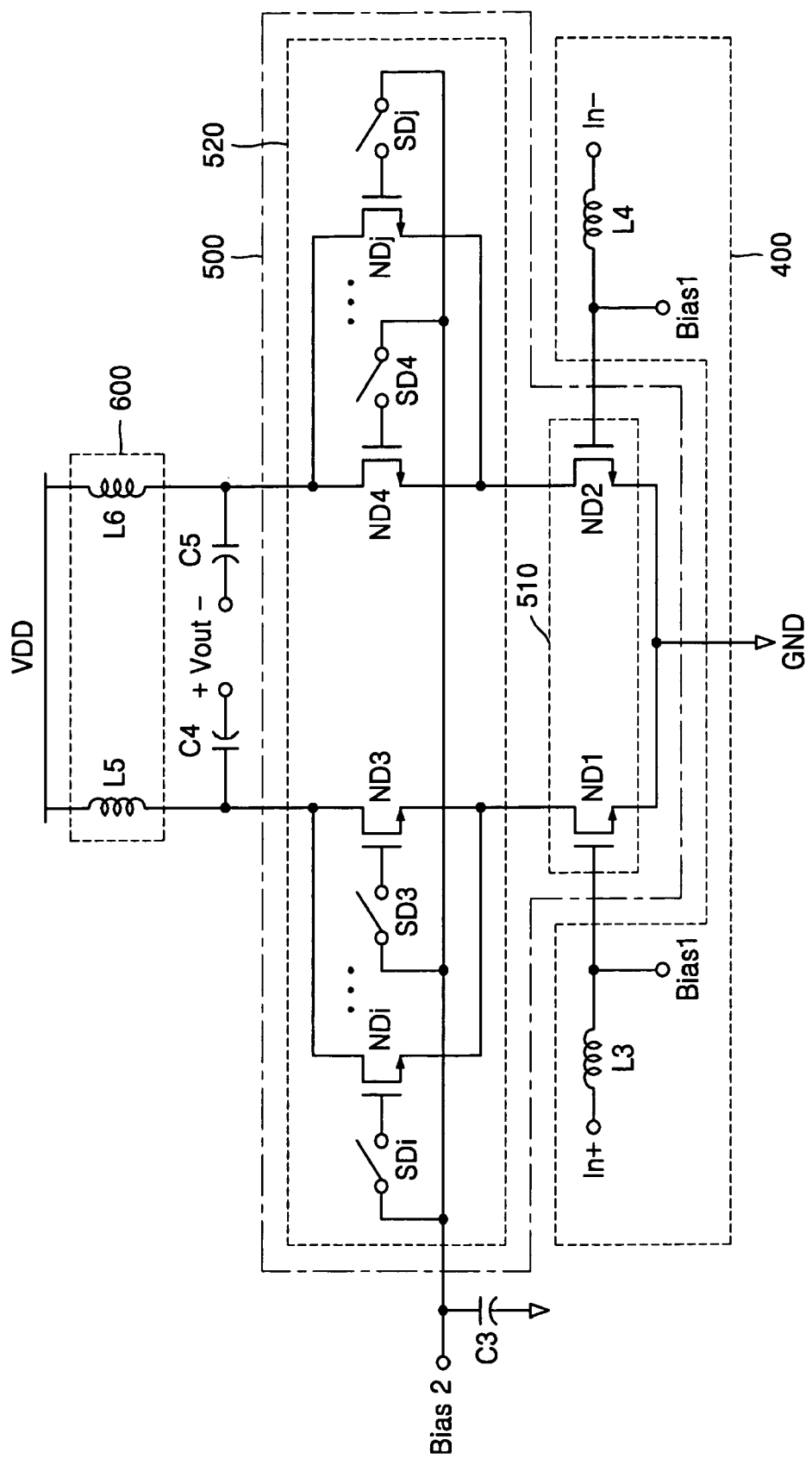
FIG. 5 is a circuit diagram of a VGA according to another exemplary embodiment of the present invention.

VGAs according to exemplary embodiments of the present invention of FIGS. 3 and 5 are designed so that a first stage of a cascode amplification unit can have a fixed impedance regardless of a change of an amplification gain and that a variable gain determination unit comprised of a plurality of transistors is formed at an upper stage of the cascode amplification unit. Accordingly, a change of an input impedance of the VGA due to a change of an amplification gain is prevented, and a change of a noise figure is stabilized.

FIG. 3 is a circuit diagram of a VGA according to an exemplary embodiment of the present invention. Referring to FIG. 3, the VGA includes an input matching unit 100, a cascode amplification unit 200, and an output matching unit 300.

The input matching unit 100 provides impedance matching with an input impedance of the cascode amplification unit 200 on the side of node A. The input matching unit 100 includes a first inductor L1. One end of the first inductor L1 is connected to an input port In, and the other end thereof is connected to the input node A of the cascode amplification unit 200. Without being limited to what is shown in FIG. 3, a capacitor or the like may be further connected to the first inductor L1.

The cascode amplification unit 200 includes a common source amplification unit 210 and a variable gain determination unit 220.

The common source amplification unit 210 comprises a single NMOS transistor NM1 to prevent an input impedance from varying according to a change of an amplification gain. A gate of the NMOS transistor NM1 is connected to the node A to receive a signal to be amplified. A first bias voltage Bias 1 is transmitted to the gate of the NMOS transistor NM1 via the node A to bias the NMOS transistor NM1.

A source of the NMOS transistor NM1 is grounded, and a drain thereof is connected to sources of NMOS transistors NM2, NM3, . . . , and NMi, which constitute the variable gain determination unit 220. Hence, the NMOS transistor NM1 of the common source amplification unit 210 is cascode connected to the NMOS transistors NM2, NM3, . . . , and NMi of the variable gain determination unit 220.

The variable gain determination unit 220 includes the NMOS transistors NM2 through NMi, which are commonly connected to the drain of the NMOS transistor NM1, and a plurality of switches S2, S3, . . . , and Si, which are connected to gates of the NMOS transistors NM2 through NMi, respectively. The numbers of NMOS transistors and switches that constitute the variable gain determination unit 220 may depend on the number of amplification gain stages.

The switches S2 through Si are connected to a second bias voltage Bias 2 and turned on/off to control on/off operations of the NMOS transistors NM2 through NMi. The NMOS transistors NM2 through NMi have different characteristic values, for example, transconductance ($g_m$) values. An amplification gain at a stage of the variable gain determination unit 220 varies according to which one of the transistors NM2 through NMi is turned on. A first capacitor C1 is used to ground an AC signal.

Figure 4:
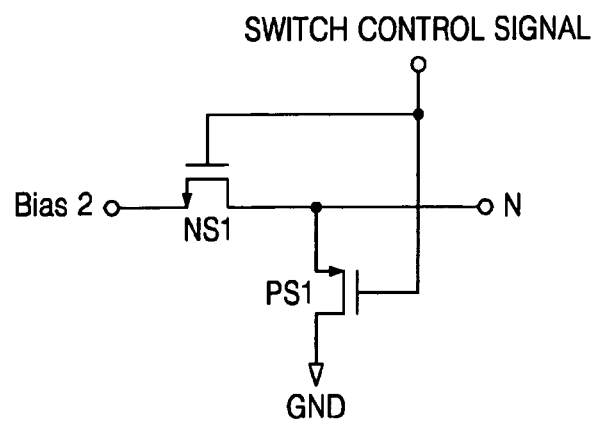
FIG. 4 is a circuit diagram of a switch according to the present invention.

FIG. 4 is a circuit diagram of an example of each of the switches S2 through Si. Referring to FIG. 4, the exemplary switch comprises an NMOS transistor NS1 and a PMOS transistor PS1. A source of the NMOS transistor NS1 is connected to the second bias voltage Bias 2, and a drain thereof is connected to a source of the PMOS transistor PS1. A drain of the PMOS transistor PS1 is grounded. A switch control signal output by a switch control unit (not shown) is input to gates of the NMOS transistor NS1 and the PMOS transistor PS1. The switch control signal is used to turn on one of the switches SW2 through SWi depending on a value of an amplification gain. A node N between the drain of the NMOS transistor NS1 and the source of the PMOS transistor PS1 is connected to the NMOS transistor NM2, ..., or NMi.

The switch of FIG. 4 operates as follows. If the switch control signal is logic high, the NMOS transistor NS1 and the PMOS transistor PS1 are both turned on, and the second bias voltage Bias 2 input to the source of the NMOS transistor NS1 is transmitted to the gate of the NMOS transistor NM2, ..., or NMi of the variable gain determination unit 220 via the node N. On the other hand, if the switch control signal is logic low, the NMOS transistor NS1 and the PMOS transistor PS1 are both turned off, such that the second bias voltage Bias 2 is not transmitted to the gate of the NMOS transistor NM2, ..., or NMi.

Referring back to FIG. 3, the output matching unit 300 comprises a second inductor L2 and a second capacitor C2 and provides impedance matching with an output impedance of the cascode amplification unit 200 on the side of node B. One end of the second inductor L2 is connected to an external source VDD, and the other end thereof is connected to the drains of the NMOS transistors NM2 through NMi. One end of the second capacitor C2 is connected to the drains of the NMOS transistors NM2 through NMi, and the other end thereof forms an output port OUT.

In an operation of the VGA of FIG. 3 having such a structure, a change of an amplification gain occurs while an input signal is primarily amplified in the common source amplification unit 210 and secondarily amplified by one of the NMOS transistors NM2 through NMi, which constitute the variable gain determination unit 220. In other words, there are no changes of the amplification gain by the NMOS transistor NM1 of the common source amplification unit 210, but the amplification gain varies according to which one of the NMOS transistors NM2 through NMi, which are selectively turned on/off by the switches S2 through Si, is turned on. As a result, the entire amplification gain varies.

More specifically, a signal input via the input port In is transmitted to the gate of the NMOS transistor NM1 of the common source amplification unit 210 via the input matching unit 100. The signal primarily amplified by the NMOS transistor NM1 is output as a drain current of the NMOS transistor NM1. The amplified signal is secondarily amplified by an on-state transistor among the NMOS transistors NM2 through NMi of the variable gain determination unit 220. Since the NMOS transistors NM2 through NMi have different amplification gains (i.e., transconductance), the amplification gain varies according to which one of the NMOS transistors NM2 through NMi is turned on.

This amplification gain variation can be detailed with reference to the following Equations. First, an overall transconductance Gm of the cascode amplification unit 200 is calculated using Equation 1:

$$G_m = \frac{g_{m1}r_{o1}[1+(g_{m2}+g_{mb2})r_{o2}]}{r_{o2}+r_{o1}[1+(g_{m2}+g_{mb2})r_{o2}]} \approx g_{m1} \quad (1)$$

wherein $g_{m1}$ denotes a transconductance of the NMOS transistor NM1, $g_{m2}$ denotes a transconductance of an on-state NMOS transistor in the variable gain determination unit 220, $g_{mb2}$ denotes a transconductance of the on-state NMOS transistor due to a body effect, $r_{o1}$ denotes an output impedance of the NMOS transistor NM1, and $r_{o2}$ denotes an output impedance of the on-state NMOS transistor, that is, an NMOS transistor selected from the NMOS transistors of the variable gain determination unit 220. As approximated in Equation 1, the overall transconductance $G_m$ of the cascode amplification unit 200 depends on the transconductance $g_{m1}$ of the NMOS transistor NM1, by which the input signal is primarily amplified.

An output impedance Rout on the side of the output port OUT is calculated using Equation 2:

$$R_{out} = [1+(g_{m2}+g_{mb2})r_{o2}]r_{o1}+r_{o2} \approx (g_{m2}+g_{mb2})r_{o2}r_{o1} \quad (2)$$

Hence, when an impedance of a load connected to the output port OUT is $R_{load}$, an amplification gain $A_v$ of the cascode amplification unit 200 is expressed as in Equation 3, which is based on Equations 1 and 2:

$$A_v = G_m(R_{out}//R_{load}) \approx g_{m1}(g_{m2}+g_{mb2})r_{o2}r_{o1} \quad (3)$$

Referring to Equation 3, the transconductance $g_{m1}$ of the NMOS transistor NM1 is fixed, and $g_{m2}$ and $g_{mb2}$ vary according to which one of the NMOS transistors NM2 through NMi of the variable gain determination unit 220 is turned on. Consequently, the amplification gain $A_v$ varies according to which one of the NMOS transistors NM2 through NMi of the variable gain determination unit 220 is turned on.

In the VGA of FIG. 3, a first stage of the cascode amplification unit 200, which amplifies a received signal, is constituted of the single NMOS transistor NM1, such that a variation of an input impedance due to a variation of the amplification gain can be narrowed.

Figure 1:
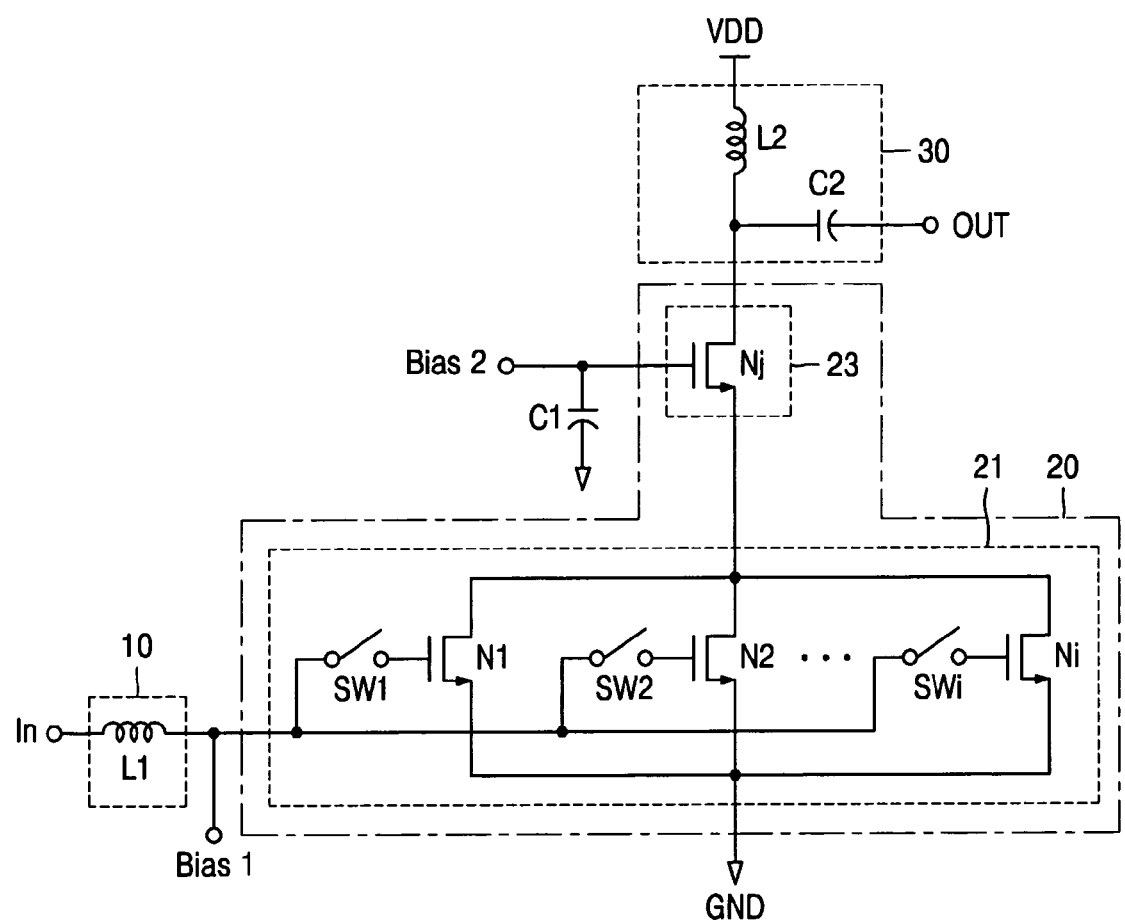
FIG. 1 is a circuit diagram of a conventional VGA.

As well known, a first stage of a multi-stage amplifier greatly affects a noise figure. In a conventional VGA of FIG. 1, a common source amplification unit 21 comprised of a plurality of transistors is formed at a first stage of a cascode amplification unit 20 to vary an amplification gain. Hence, an input impedance of the cascode amplification unit 20 varies according to which one of the transistors of the common source amplification unit 21 is turned on. The variation of the input impedance has a negative influence upon the noise figure. However, in the VGA of FIG. 3 according to an exemplary embodiment of the present invention, the common source amplification unit 210, which primarily amplifies an input signal, is constituted of the single NMOS transistor NM1, and the variable gain determination unit 220 for determining an amplification gain is formed at a stage above a stage of the common source amplification unit 210 so that the common source amplification unit 210 and the variable gain determination unit 220 are coupled together in a cascode configuration. Thus, the variation of the input impedance due to the variation of the amplification gain can be prevented.

FIG. 5 is a circuit diagram of a VGA according to another exemplary embodiment of the present invention. The structure and operation of the VGA of FIG. 3 are similar to those of the VGA of FIG. 5 except that the VGA of FIG. 3 is constructed like a differential amplifier.

Referring to FIG. 5, the VGA includes an input matching unit 400, a differential cascode amplification unit 500, and an output matching unit 600.

Similar to the VGA of FIG. 3, the input matching unit 400 provides impedance matching an input impedance of the differential cascode amplification unit 500. The input matching unit 400 comprises third and fourth inductors L3 and L4, which are connected to differential input ports In+ and In−, respectively. It is apparent that the input matching unit 400 may further include a capacitor or the like without being limited to what is shown in FIG. 5.

The differential cascode amplification unit 500 includes a differential common source amplification unit 510 and a differential variable gain determination unit 520.

The differential common source amplification unit 510 comprises a pair of transistors ND1 and ND2, whose sources are grounded and which are disposed in a structure of a differential amplifier. Gates of the transistors ND1 and ND2 are connected to the differential input ports In+ and In−, respectively, and first bias voltages Bias 1 to receive a signal and a bias voltage, respectively.

Drains of the transistors ND1 and ND2 are cascode connected to sources of a plurality of transistors ND3 through NDj, which constitute the differential variable gain determination unit 520.

The differential variable gain determination unit 520 includes the transistors ND3 through NDj, which form differential pairs, and a plurality of switches SD3 through SDj, which are connected to gates of the transistors ND3 trough NDj, respectively. An amplified differential signal Vout is output to drains of the transistors ND3 through NDj.

The switches SD3 through SDj are connected to a second bias voltage Bias 2 and selectively turn on/off differential transistor pairs ND3 and ND4 through NDi and NDj to vary an amplification gain of the differential variable gain determination unit 520. More specifically, transistors ND3 and ND4, . . . , and NDi and NDj are differential pairs, and two switches connected to each differential transistor pair are concurrently turned on/off according to the amplification gain. For example, the switches SD3 and SD4 connected to gates of a different pair of transistors ND3 and ND4 are concurrently turned on/off according to a switch control signal output by a switch control unit (not shown). The amplification gain of the differential variable gain determination unit 520 varies according to which one of the differential transistor pairs of the differential variable gain determination unit 520 is turned on. A third capacitor C3 is used to ground an AC signal.

The output matching unit 600 includes a fifth inductor L5 and a sixth inductor L6, but may further include a capacitor or the like in some cases. The output matching unit 600 provides impedance matching with an output impedance of the differential cascode amplification unit 500.

In the VGA of FIG. 5, the signals input via the differential input ports In+ and In− is transmitted to the differential common source amplification unit 510 via the input matching unit 400 and primarily amplified by the differential common source amplification unit 510. The amplified signal is secondarily amplified by a differential pair of transistors in the differential variable gain determination unit 520 that is turned on by selective on/off operations of the switches SD3 through SDj. The secondarily amplified signal is output as the differential signal Vout.

Similar to the VGA of FIG. 3, the VGA of FIG. 5 forms the pair of transistors ND1 and ND2 in the VGA of FIG. 5 at a first stage of the differential cascode amplification unit 500 for amplifying an input signal. Accordingly, a variation of the input impedance of the VGA with a variation of the amplification gain of the VGA can be reduced, and a variation of a noise figure can be stabilized.

The VGAs of FIGS. 3 and 5 may be each implemented as a single chip. Alternatively, only the cascode amplification unit 200 or 500 may be implemented as a single chip, and the remaining inductors and capacitors may be connected to an external device.

FIGS. 6A to 6D show graphs illustrating a gain, a noise figure, input impedance matching, and output impedance matching, respectively, of each of the VGAs of FIGS. 3 and 5. The graphs of FIGS. 6A to 6D show results of simulations on a 0.18 μm CMOS RF MOSFET within a frequency range of 4.7 to 5.3 GHz.

Figures 2A, 2B, 2C, 2D:
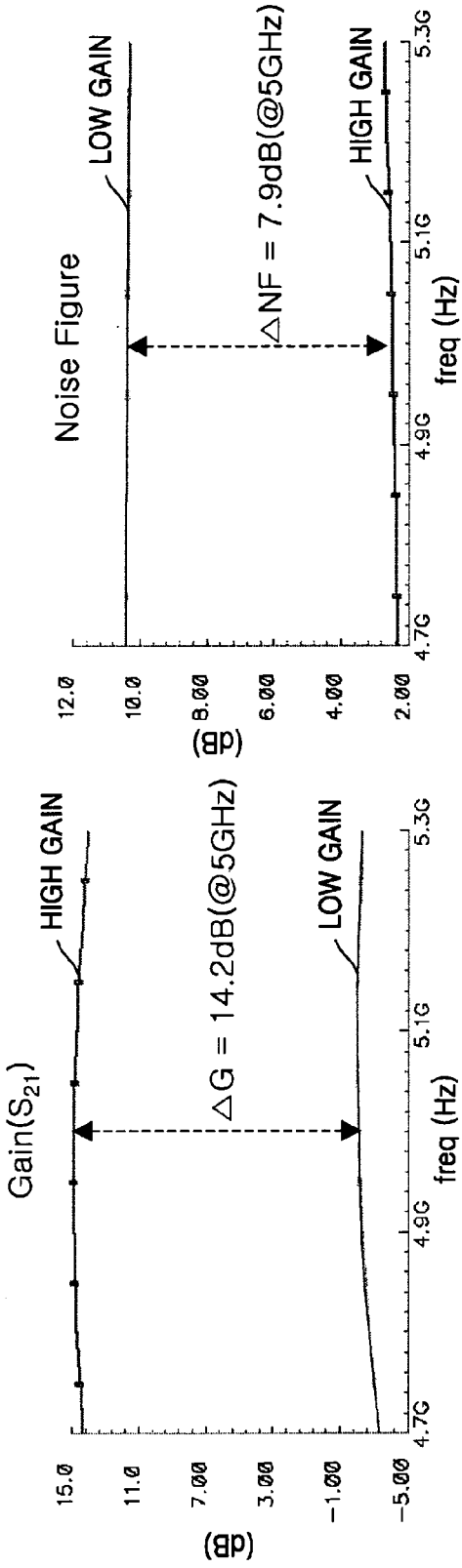
FIGS. 2A to 2D are graphs illustrating characteristics of the VGA of FIG. 1.
Figure 6A:
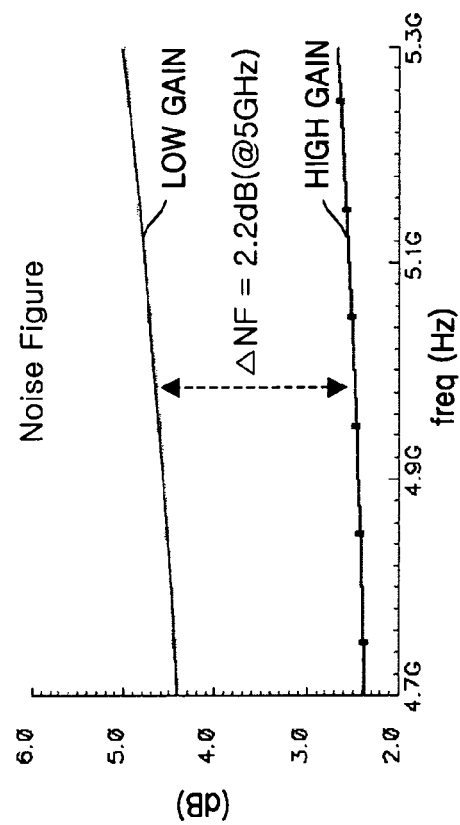
FIGS. 6A to 6D are graphs illustrating characteristics of the VGAs of FIGS. 3 and 5.
Figure 6B:
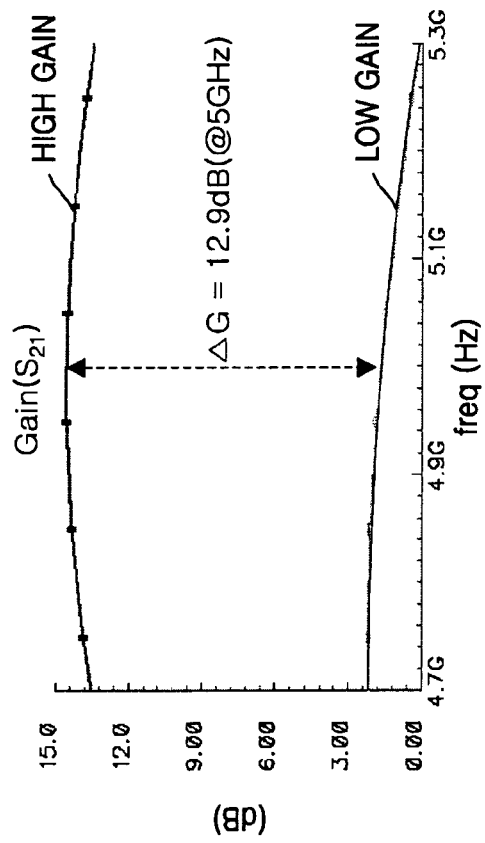

Referring to FIG. 6B, a difference between noise figures in a high gain mode and a low gain mode at an operating frequency of 5 GHz is 2.2 dB, which is smaller than 7.9 dB in the noise figure graph of FIG. 2. It is seen that the VGAs of FIGS. 3 and 5 even in a low gain mode have stable noise figures, which are no more than 5 dB.

Figure 6C:
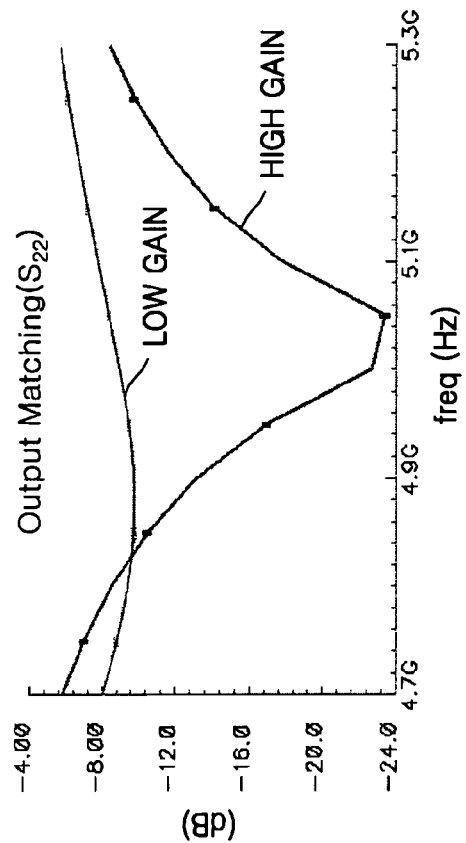

Referring to graph $S_{11}$ in FIG. 6C, which illustrates input impedance matching, an input impedance matching value in a low gain mode is no more than −10 dB all over the frequency range of 4.7 to 5.3 GHz. Hence, the VGAs of FIGS. 3 and 5 provide good input impedance matching.

Figure 6D:
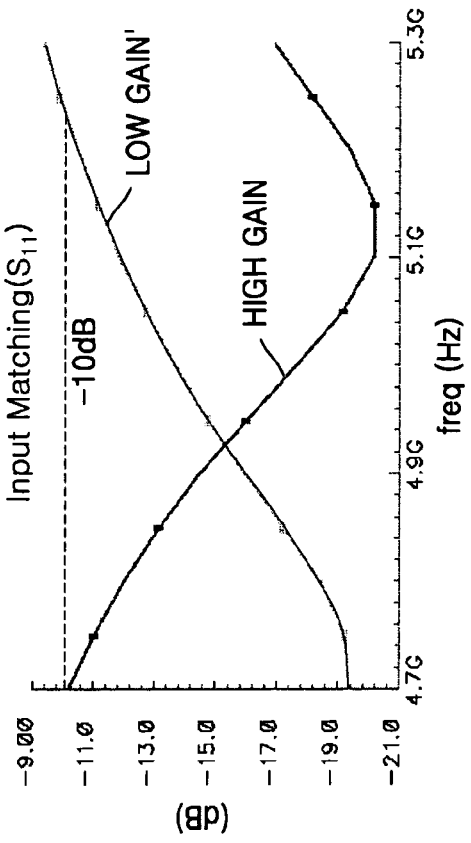

As shown in FIG. 6A, a control range of an amplification gain is about 13 dB, so it is wide. As shown in FIG. 6D, an output impedance matching value is no more than −8 dB, so the VGAs of FIGS. 3 and 5 provide good output impedance matching.

As described above, the VGAs of FIGS. 3 and 5 can reduce a variation of an input impedance due to a variation of an amplification gain and stabilize a noise figure.

Exemplary embodiments of VGAs in which an amplification gain of an amplification unit is controlled by adjusting a voltage applied to the amplification unit by controlling current output by a current supply source are shown in FIGS. 7, 8, 9, and 10.

Figure 7:
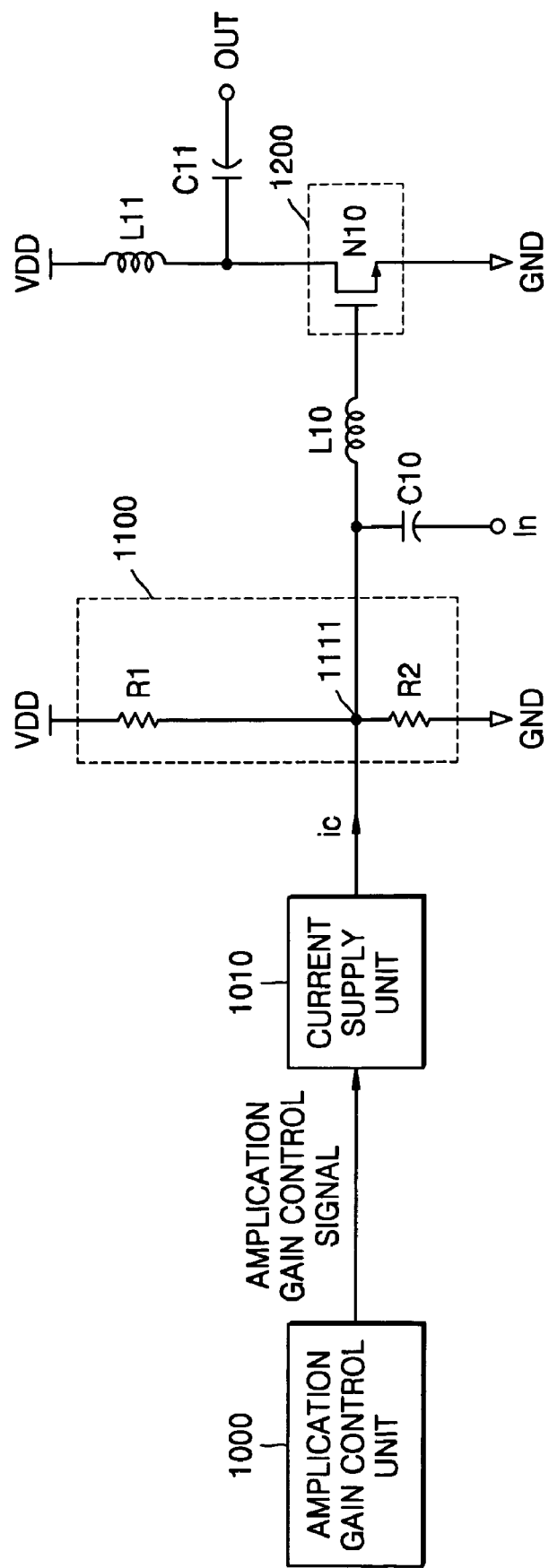
FIG. 7 is a circuit diagram of a VGA according to another exemplary embodiment of the present invention.

FIG. 7 is a circuit diagram of a VGA according to another exemplary embodiment of the present invention. Referring to FIG. 7, the VGA includes an amplification gain control unit 1000, a current supply unit 1010, a bias unit 1100, and an amplification unit 1200.

The amplification gain control unit 1000 outputs an amplification gain control signal.

The current supply unit 1010 receives the amplification gain control signal from the amplification gain control unit 1000 and outputs an amplification gain control current $i_c$ that depends on an amplification gain. A digital-to-analog converter (DAC) may be used as the current supply unit 1010. In this case, the amplification gain control signal output by the amplification gain control unit 1000 is a digital signal, and the digital amplification gain control signal is converted into the amplification gain control current $i_c$ by the current supply unit 1010.

The bias unit 1100 includes first and second division resistors R1 and R2 connected in series between a supply voltage VDD and a ground voltage GND. The first division resistor R1 is connected between the supply voltage VDD and the current supply unit 1010, and the second division resistor R2 is connected between the current supply unit 1010 and the ground voltage GND. A node 1111 between the first and second division resistors R1 and R2 is connected to the amplification unit 1200. As described later, a voltage applied to the node 1111 is used as a control voltage for determining an amplification gain of the amplification unit 1200. The node 1111 has a voltage V1+V2, which is a sum of a voltage V1, into which the supply voltage VDD is divided by the first and second division resistors R1 and R2, and a voltage V2 provided by the amplification gain control current $i_c$ output by the current supply unit 1010 and flowing through the second division resistor R2.

More specifically, the supply voltage VDD is divided by the first and second division resistors R1 and R2, such that a voltage V1 of $\{R2/(R1+R2)\} \times VDD$ is applied to the node 1111. The amplification gain control current $i_c$ output by the current supply unit 1010 passes through the second division resistor R2, which is connected to the ground voltage GND, such that a voltage V2 of $i_c \times R2$ is applied to the node 1111. Hence, the node 1111 has a voltage V1+V2 of $\{(R2/(R1+R2)) \times VDD + (i_c \times R2)\}$.

The amplification unit 1200 includes an NMOS transistor N10, which receives a signal via a gate and amplifies the signal. The gate of the NMOS transistor N10 is connected to the node 1111 and an input port In. As shown in FIG. 7, an inductor L10 connected between the NMOS transistor N10 and the node 1111, a capacitor C10 connected between the node 1111 and the input port In, and the like may be further included to achieve input impedance matching.

As shown in FIG. 7, the NMOS transistor N10 is a common source amplifier having a gate through which a signal is received and a source grounded. A signal amplified by the NMOS transistor N10 is output via a drain of the NMOS transistor N1. An inductor L11 and a capacitor C1 for output impedance matching may be connected to the drain of the NMOS transistor N10.

In an operation of the VGA of FIG. 7, the amplification gain control unit 1000 outputs the amplification gain control signal to the current supply unit 1010 to determine a size of the amplification gain control current $i_c$ to be output by the current supply unit 1010.

The current supply unit 1010 outputs an amplification gain control current $i_c$ that is controlled according to the amplification gain control signal to be proportional to an amplification gain. For example, if the amplification gain control signal is for increasing the amplification gain, the current supply unit 1010 increases the size of the amplification gain control current $i_c$ and outputs a resultant current. If the amplification gain control signal is for decreasing the amplification gain, the current supply unit 1010 decreases the size of the amplification gain control current $i_c$ and outputs a resultant current.

The amplification gain control current $i_c$ output by the current supply unit 1010 flows through the second division resistor R2, such that the voltage V2 of $i_c \times R2$ is applied to the node 1111. The supply voltage VDD is divided according to a ratio of resistances of the first and second division resistors R1 and R2, such that the voltage V1 of $\{R2/(R1+R2)\} \times VDD$ is also applied to the node 1111. consequently, the voltage V1+V2 of $\{(R2/(R1+R2)) \times VDD + (i_c \times R2)\}$, which is calculated based on the amplification gain control current $i_c$ and the divided supply voltage VDD, is applied to the node 1111.

An amplification gain $A_v$ of the NMOS transistor N 10 of the amplification unit 1200 depends upon the voltage V1+V2 applied to the node 1111 for the following reason.

Transconductance of the NMOS transistor N10, $g_{m1}$, is expressed as in Equation 4:

$$g_{m1} = \mu_n C_{ox} \frac{W}{L}(V_{gs} - V_{Th}) \qquad (4)$$

Since the electron mobility $\mu_n$, the capacitance per unit area $C_{ox}$ of the parallel-plate capacitor, the width W of a channel region, the length L of the channel region, and the threshold voltage $V_{Th}$ are constants determined by the processing technology used to fabricate the NMOS transistor N10, the transconductance $g_{m1}$ of the NMOS transistor N10 depends on a voltage applied between the gate and source of the NMOS transistor N10, $V_{gs}$. As well known, the amplification gain $A_v$ of the NMOS transistor N10 of the amplification unit 1200 is a product of the transconductance $g_{m1}$ and an output impedance $R_{out}$, that is, $(g_{m1} \times R_{out})$. Hence, when the gate voltage $V_{gs}$ of the NMOS transistor N10 varies, the transconductance $g_{m1}$ of the NMOS transistor N10 varies, and the amplification gain $A_v$ of the NMOS transistor N10 also varies.

Consequently, the VGA of FIG. 7 varies the size of the amplification gain control current $i_c$ to be output by the current supply unit 1010 to adjust the gate voltage of the NMOS transistor N10, thereby varying the amplification gain of the NMOS transistor N10. Also, in the VGA of FIG. 7, an input impedance on the side of the gate of the NMOS transistor N10 does not vary even when the amplification gain varies, so that stable input impedance matching is obtained.

Figure 8:
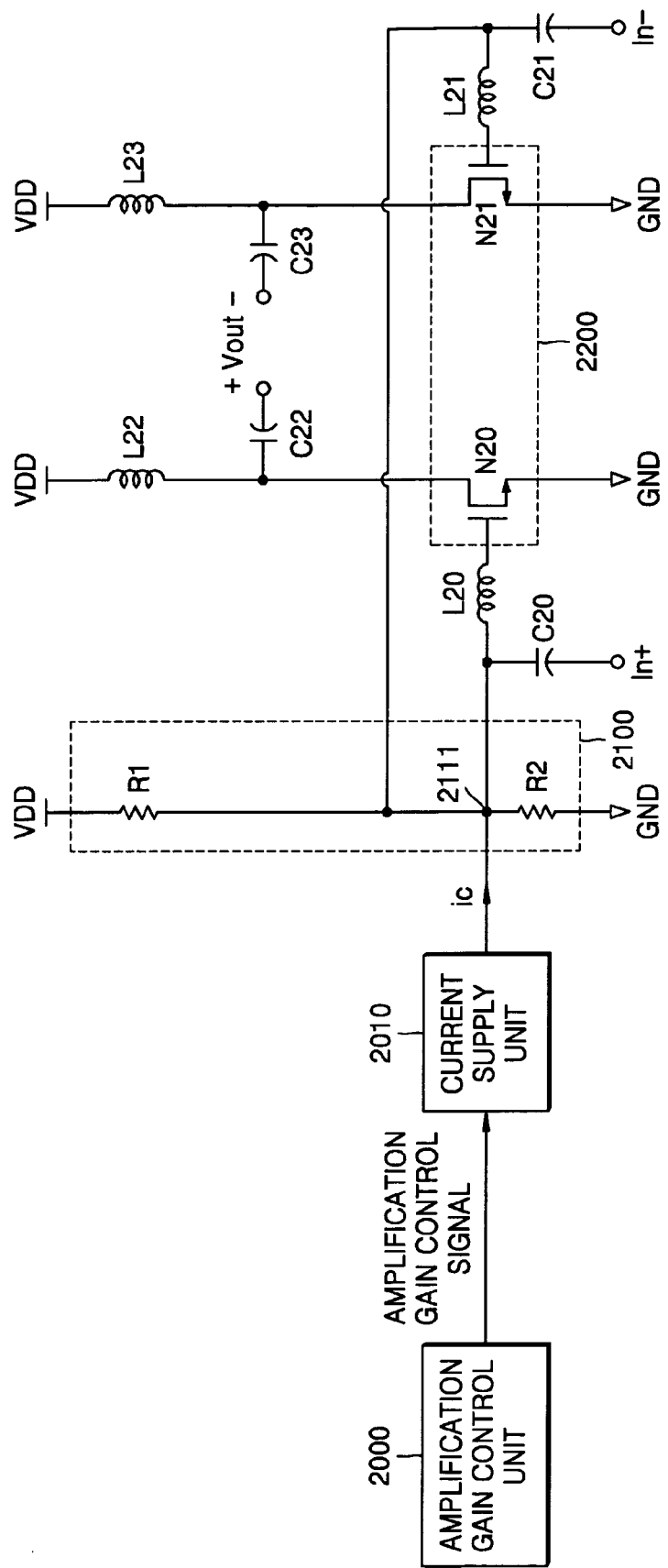
FIG. 8 is a circuit diagram of a VGA according to another exemplary embodiment of the present invention.

FIG. 8 is a circuit diagram of a VGA according to another exemplary embodiment of the present invention. The VGA of FIG. 8 is similar to that of FIG. 7 except that a structure of a differential amplifier which amplifies differential signals input via input ports In+ and In− is adopted.

More specifically, the VGA of FIG. 8 includes an amplification gain control unit 2000, a current supply unit 2010, a bias unit 2100, and a differential amplification unit 2200.

Similar to the VGA of FIG. 7, the current supply unit 2010 of FIG. 8 outputs an amplification gain control current $i_c$, whose value is controlled according to an amplification gain control signal received from the amplification gain control unit 2000 to be proportional to an amplification gain.

A voltage V1 of $\{R2/(R1+R2)\} \times VDD$, which is obtained by dividing a supply voltage VDD using first and second division resistors R1 and R2 of the bias unit 2100, and a voltage V2 of $i_c \times R2$ which is obtained by the amplification gain control current $i_c$ flowing through the second division resistor R2, are applied to a node 2111 between the first and second division resistors R1 and R2.

The differential amplification unit 2200 includes a differential pair of NMOS transistors N20 and N21. Gates of the NMOS transistors N20 and N21 are connected to the differential input ports In+ and In−, respectively, and the node 2111, and sources thereof are grounded.

As shown in FIG. 8, inductors L20 and L21 for input impedance matching may be further included between the gate of the NMOS transistor N20 and the node 2111. Also, capacitors C20 and C21 for input impedance matching may be further included between the node 2111 and the differential input port In+ and between the node 2111 and the differential input port In−, respectively.

Signals amplified by the differential amplification unit 2200 are output as differential signals Vout via drains of the NMOS transistors N20 and N21. Inductors L22 and L23 and capacitors C22 and C23 for output impedance matching may be further connected to the drains of the NMOS transistors N20 and N21.

The VGA of FIG. 8 operates similarly to the VGA of FIG. 7. In other words, a voltage applied to the node 2111, that is, a gate voltage of the NMOS transistors N20 and N21 of the differential amplification unit 2200, varies according to a size of the amplification gain control current $i_c$ output by the current supply unit 2010. Accordingly, the transconductance of the differential amplification unit 2200 varies, leading to a variation of the amplification gain of the differential amplification unit 2200.

Consequently, in the VGA of FIG. 8, the amplification gain of the differential amplification unit 2200 varies with a variation of a voltage applied to the gates of the NMOS transistors N20 and N21, and input impedances of the NMOS transistors N20 and N21 are stable.

Figure 9:
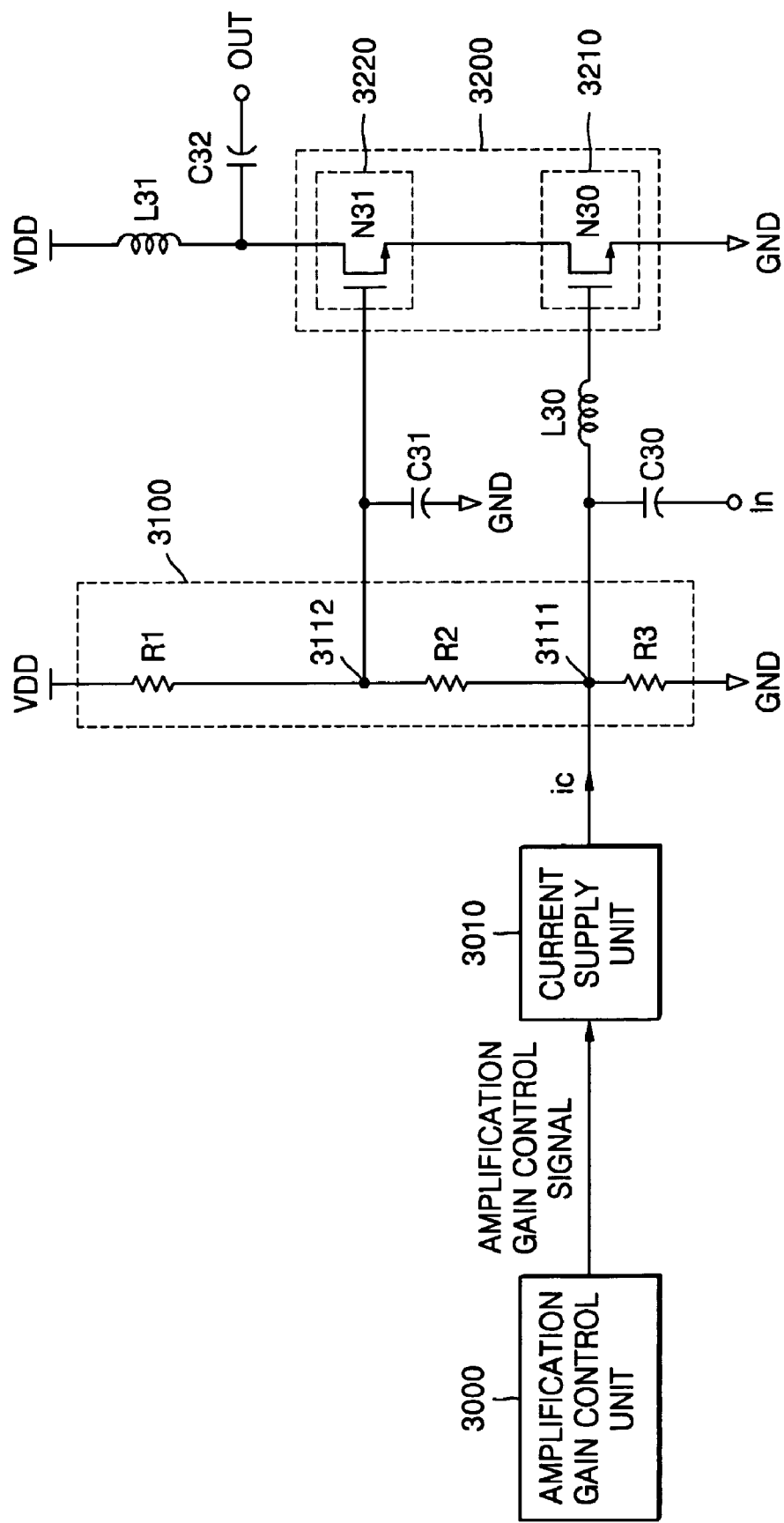
FIG. 9 is a circuit diagram of a VGA according to another exemplary embodiment of the present invention.

FIG. 9 is a circuit diagram of a VGA according to another exemplary embodiment of the present invention. The VGA of FIG. 9 is similar to that of FIG. 8 except that a cascode amplification unit 3200 is used instead of the differential amplification unit 2200. Since the cascode amplification unit 3200 can improve isolation between input and output ports, generation of noise due to interference between the input and output ports can be prevented.

More specifically, the VGA of FIG. 9 includes an amplification gain control unit 3000, a current supply unit 3010, a bias unit 3100, and a cascode amplification unit 3200.

Similar to the VGAs of FIGS. 7 and 8, the current supply unit 3010 outputs an amplification gain control current $i_c$ which is controlled according to an amplification gain control signal received from the amplification gain control unit 3000 to be proportional to an amplification gain.

The bias unit 3100 includes first, second, and third division resistors R1, R2, and R3 connected in series between a supply voltage VDD and a ground voltage GND.

The cascode amplification unit 3200 includes a first amplification unit 3210 and a second amplification unit 3220 which are cascode connected to each other. To be more specific, a node 3111 between the second and third division resistors R2 and R3 of the bias unit 3100 is connected to a gate of an NMOS transistor N30, which constitutes the first amplification unit 3210. A node 3112 between the first and second division resistors R1 and R2 of the bias unit 3100 is connected to a gate of an NMOS transistor N31, which constitutes the second amplification unit 3220. It is apparent to those of ordinary skill in the art that the division resistors R1, R2, and R3 of the bias unit 3100 may be replaced by load means and that the number of division resistors that constitute the bias unit 3100 may vary.

The gate of the NMOS transistor N30 of the first amplification unit 3210 is connected to an input port In, and a source thereof is grounded. A drain of the NMOS transistor N30 is connected to a source of the NMOS transistor N31 of the second amplification unit 3220 to form a cascode structure. A signal amplified by the NMOS transistor N31 is output via the drain of the NMOS transistor N31.

In FIG. 9, an inductor L30 connected between the gate of the NMOS transistor N30 and the node 3111 and a capacitor C30 connected between the node 3111 and the input port In are used for achieving input impedance matching. A capacitor C31 connected between the node 3112 and a ground voltage GND is used to ground an AC of the NMOS transistor N31. An inductor L31 and a capacitor C32 connected to the drain of the NMOS transistor N31 are used for achieving output impedance matching.

In an operation of the VGA of FIG. 9 having such a structure, the amplification gain control unit 3000 and the current supply unit 3010 operate in the same manner as in the VGAs of FIGS. 7 and 8. In other words, the amplification gain control unit 3000 outputs the amplification gain control signal to the current supply unit 3010 to control a size of the amplification gain control current $i_c$ to be output by the current supply unit 3010.

The current supply unit 3010 outputs an amplification gain control current $i_c$ that is controlled according to the control of the amplification gain control signal to be proportional to an amplification gain.

The amplification gain control current $i_c$ output by the current supply unit 3010 flows through the third division resistor R3. Accordingly, a voltage V2 of $i_c \times R3$ is applied to the node 3111. A supply voltage VDD is divided according to a ratio of resistances of the first, second, and third division resistors R1, R2, and R3, such that a voltage V1 of $\{R3/(R1+R2+R3)\} \times VDD$ is also applied to the node 3111. Hence, a voltage V1+V2 of $\{(R3/(R1+R2+R3)) \times VDD+(i_c \times R3)\}$, which is calculated from the amplification gain control current $i_c$ and the divided supply voltage VDD, is applied to the node 3111.

The supply voltage VDD is divided by the first, second, and third division resistors R1, R2, and R3, so that a voltage of $\{(R2+R3)/(R1+R2+R3)\} \times VDD$ is applied to the node 3112, and the NMOS transistor N31 connected to the node 3112 is biased.

A signal input via the input port In is amplified by the NMOS transistors 3210 and 3220 of the cascode amplification unit 3200. An amplification gain of the cascode amplification unit 3200 is determined in proportion to a gate voltage of the NMOS transistor N30 of the first amplification unit 3210, that is, the voltage applied to the node 3111. A reason why the amplification gain of the cascode amplification unit 3200 varies according to the voltage of the node 3111 will now be described.

Given that a transconductance of the NMOS transistor N30 of the first amplification unit 3210 is $g_{m1}$, an output impedance of the NMOS transistor N30 is $r_{o1}$, a transconductance of the NMOS transistor N31 of the second amplification unit 3220 is $g_{m2}$, an output impedance of the NMOS transistor N31 is $r_{o2}$, and a transconductance of the NMOS transistor N31 due to a body effect is $g_{mb2}$, a transconductance $G_m$ of the cascode amplification unit 3200 is expressed as in Equation 5:

$$G_m = \frac{g_{m1} r_{o1}[1 + (g_{m2} + g_{mb2})r_{o2}]}{r_{o2} + r_{o1}[1 + (g_{m2} + g_{mb2})r_{o2}]} \approx g_{m1} \tag{5}$$

Referring to Equation 5, the transconductance of the cascode amplification unit 3200, $G_m$, depends on the transconductance $g_{m1}$ of the NMOS transistor N30 of the first amplification unit 3210, to which an input signal is initially transmitted.

An output impedance $R_{out}$ of the cascode amplification unit 3200 on the side of an output port OUT is expressed as in Equation 6:

$$R_{out} = [1+(g_{m2}+g_{mb2})r_{o2}]r_{o1}+r_{o2} \approx (g_{m2}+g_{mb2})r_{o2}r_{o1} \tag{6}$$

An amplification gain $A_v$ of the cascode amplification unit 3200 is expressed as in Equation 7, which is based on Equations 5 and 6:

$$A_v = -G_m R_{out} \approx -g_{m1}(g_{m2}+g_{mb2})r_{o2}r_{o1} \tag{7}$$

Referring to Equation 7, the values of $r_{o1}$, $r_{o2}$, $g_{m2}$, and $g_{mb2}$ are fixed, so the amplification gain $A_v$ of the cascode amplification unit 3200 depends on the transconductance $g_{m1}$ of the NMOS transistor N30. As expressed in Equation 4, the transconductance $g_{m1}$ of the NMOS transistor N30 varies according to a voltage $V_{gs}$ between the gate and the source of the NMOS transistor N30.

Accordingly, the VGA of FIG. 9 can vary an amplification gain by adjusting the gate voltage of the NMOS transistor N30 of the first amplification unit 3210 by controlling a size of the amplification gain control current $i_c$ to be output by the current supply unit 3010.

Also, since the input impedance of the cascode amplification unit 3200 is fixed regardless of a variation of the amplification gain, a noise figure can be stable even upon a variation of the amplification gain.

Figure 10:
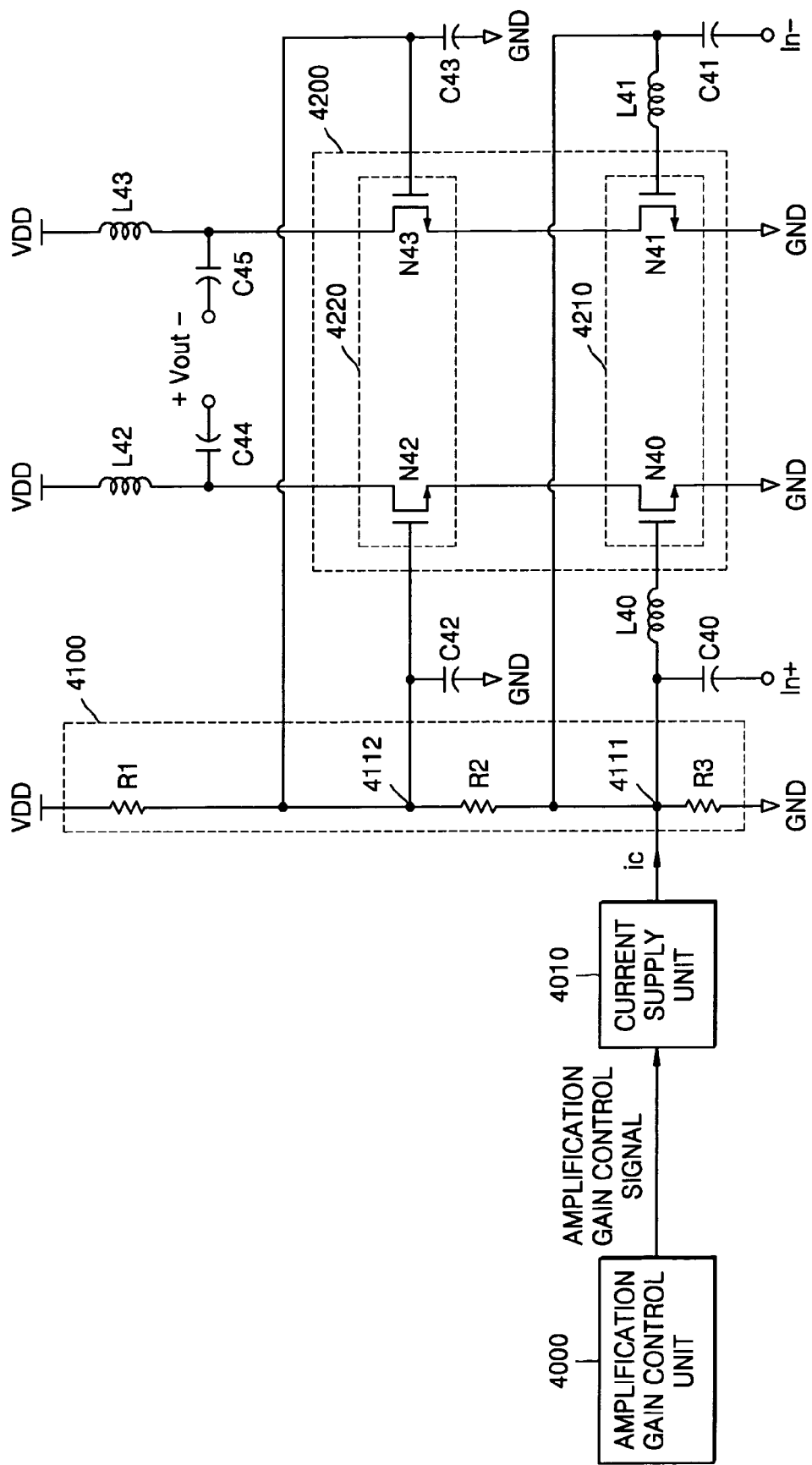
FIG. 10 is a circuit diagram of a VGA according to another exemplary embodiment of the present invention.

FIG. 10 is a circuit diagram of a VGA according to another exemplary embodiment of the present invention. The VGA of FIG. 10 is similar to that of FIG. 9 except that a differential cascode amplification unit 4200, comprised of differential transistor pairs N40 and N41 and N42 and N43, is included instead of the cascode amplification unit 3200.

The VGA of FIG. 10 includes an amplification gain control unit 4000, a current supply unit 4010, a bias unit 4100, and a differential cascode amplification unit 4200.

Similar to the VGAs of FIGS. 7, 8, and 9, the current supply unit 4010 outputs an amplification gain control current $i_c$ which is controlled according to an amplification gain control signal received from the amplification gain control unit 4000 to be proportional to an amplification gain.

A voltage of $\{(R2+R3)/(R1+R2+R3)\} \times VDD$, into which a supply voltage VDD is divided, is applied to a node 4112 between first and second division resistors R1 and R2 of the bias unit 4100. A voltage of $\{(R3/(R1+R2+R3)) \times VDD+(i_c \times R3)\}$, which is obtained from the amplification gain control current $i_c$ and the divided supply voltage VDD, is applied to a node 4111 between second and third division resistors R2 and R3.

The differential cascode amplification unit 4200 includes a first differential amplification unit 4210 and a second differential amplification unit 4220. The first differential amplification unit 4210 comprises a common source differential NMOS transistor pair N40 and N41 whose sources are grounded. Gates of the NMOS transistors N40 and N41 are connected to differential input ports In+ and In−, respectively, and the node 4111.

The second differential amplification unit 4220 comprises a differential pair of NMOS transistors N42 and N43 cascode connected to the first differential amplification unit 4210. More specifically, a source of the NMOS transistor N42 is connected to a drain of the NMOS transistor N40, and a source of the NMOS transistor N43 is connected to a drain of the NMOS transistor N41, thereby forming a differential amplifier having a cascode structure.

Gates of the NMOS transistors N42 and N43 of the second differential amplification unit 4220 are connected to the node 4112. A differential signal Vout is output via drains of the NMOS transistors N42 and N43.

Inductors L40 and L41 connected between the gates of the NMOS transistors N40 and N41 of the first differential amplification unit 4210 and the node 4111 and capacitors C40 and C41 connected between the node 4111 and the differential input ports In+ and In− are used for achieving input impedance matching.

Capacitors C42 and C43 connected between the gates of the NMOS transistors N42 and N43 of the second differential amplification unit 4220 and a ground voltage GND are included to ground ACs of the NMOS transistors N42 and N43. Inductors L42 and L43 and capacitors C44 and C45 connected to the drains of the NMOS transistors N42 and N43 are used for achieving output impedance matching.

Accordingly, the VGA of FIG. 10 having such a structure can vary an amplification gain by adjusting gate voltages of the NMOS transistors N40 and N41 of the first differential amplification unit 4210 by controlling a size of the amplification gain control current $i_c$ to be output by the current supply unit 4010. Also, since the input impedance of the differential cascode amplification unit 4200 is fixed regardless of a variation of the amplification gain, a noise figure can be stable even when the amplification gain varies.

FIGS. 11A to 11D show graphs illustrating a gain, a noise figure, input impedance matching, and output impedance matching of each of the VGAs of FIGS. 7, 8, 9, and 10. The graphs of FIGS. 11A to 11D show results of simulations on a 0.18 µm CMOS RF MOSFET within a frequency range of 5 to 6 GHz.

Referring to FIG. 11B, a difference between noise figures in a high gain mode and a low gain mode at an operating frequency of 5 GHz is 3.3 dB, which is 40% of 7.9 dB in the noise figure graph of FIG. 2.

Referring to graphs $S_{11}$ and $S_{22}$ of FIGS. 11C and 11D, which illustrates input impedance matching and output impedance matching, input and output impedance matching values are no more than −15 dB and −14 dB, respectively, at an operating frequency of 5.5 GHz. Hence, the VGAs of FIGS. 7, 8, 9, and 10 provide good input and output impedance matching.

As described above, the VGAs of FIGS. 7, 8, 9, and 10 can control an amplification gain by adjusting voltages that are obtained from current output by current supply units and applied to the amplification units 1200, 2200, 3200, and 4200. Thus, a variation of a noise figure depending on a variation of an amplification gain is small, and input and output impedance matching is stabilized.

In a VGA according to the present invention, a variation of an input impedance depending on a variation of an amplification gain can be prevented, so that a noise figure can be improved.

In addition, input and output impedance matching can be stabilized even upon a variation of the amplification gain.

Furthermore, the control of the amplification gain using a current supplied by a current supply unit enables an amplification gain range to be wide and the amplification gain to be minutely adjusted.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A variable gain amplifier which can vary an amplification gain, the variable gain amplifier comprising:

an amplification gain control unit which outputs a control signal for controlling the amplification gain;

a current supply unit which outputs a current that is controlled according to the control signal to be proportional to the amplification gain;

a bias unit directly connected to a supply voltage which provides a voltage that is adjusted according to the current output by the current supply unit; and an amplification unit which comprises a transistor having an amplification gain which varies according to the voltage provided by the bias unit.

2. The variable gain amplifier of claim 1, wherein the bias unit comprises:
 a first division resistor connected between the supply voltage and the current supply unit; and
 a second division resistor connected between the current supply unit and a ground voltage.

3. The variable gain amplifier of claim 2, wherein the current output by the current supply unit flows through the second division resistor, such that a voltage of a node between the first and second division resistors varies.

4. The variable gain amplifier of claim 1, wherein the transistor of the amplification unit is an NMOS transistor having a source which is grounded and a gate which is connected to the bias unit and an input port, such that the amplification gain varies according to the voltage provided by the bias unit.

5. The variable gain amplifier of claim 1, wherein the control signal output by the amplification gain control unit is a digital signal.

6. The variable gain amplifier of claim 5, wherein the current supply unit comprises a digital-to-analog converter which converts the digital signal into an analog current signal.

7. The variable gain amplifier of claim 1, further comprising at least one of an inductor and a capacitor for input or output impedance matching.

8. The variable gain amplifier of claim 1, wherein the transistor of the amplification unit comprises a differential transistor pair.

9. The variable gain amplifier of claim 8, wherein the differential transistor pair comprises NMOS transistors having sources which are grounded and gates which are connected to the bias unit and differential input ports, such that the amplification gain varies according to the voltage supplied by the bias unit.

10. The variable gain amplifier of claim 1, wherein the transistor is a single gate transistor.

11. The variable gain amplifier of claim 1, further comprising at least one of an inductor and a capacitor connected in-between the bias unit and the amplification unit.

12. The variable gain amplifier of claim 1, wherein the transistor is connected to the supply voltage.

13. The variable gain amplifier of claim 7, wherein input impedance does not vary even when the amplification gain varies.

* * * * *